(12) United States Patent
Lee et al.

(10) Patent No.: US 8,238,143 B2
(45) Date of Patent: Aug. 7, 2012

(54) MAGNETIC TUNNEL JUNCTION DEVICE AND FABRICATION

(75) Inventors: Kangho Lee, San Diego, CA (US);
Xiaochun Zhu, San Diego, CA (US);
Xia Li, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 136 days.

(21) Appl. No.: 12/638,460

(22) Filed: Dec. 15, 2009

(65) Prior Publication Data
US 2011/0141796 A1    Jun. 16, 2011

(51) Int. Cl.
*G11C 11/00* (2006.01)
(52) U.S. Cl. .......... 365/158; 365/173; 365/171; 365/97; 365/50
(58) Field of Classification Search .................. 365/158, 365/173, 171, 97, 50, 55
See application file for complete search history.

(56) References Cited

U.S. PATENT DOCUMENTS

| 7,009,877 | B1 | 3/2006 | Huai et al. |
| 7,088,609 | B2 | 8/2006 | Valet |
| 7,252,852 | B1 | 8/2007 | Parkin |
| 7,300,711 | B2 | 11/2007 | Parkin |
| 7,430,135 | B2 | 9/2008 | Huai et al. |
| 2006/0095889 | A1 | 5/2006 | Cote et al. |
| 2007/0076471 | A1 | 4/2007 | Kano et al. |
| 2007/0195594 | A1 | 8/2007 | Koga |
| 2007/0201265 | A1 | 8/2007 | Ranjan et al. |
| 2008/0088980 | A1* | 4/2008 | Kitagawa et al. ............. 360/313 |
| 2008/0179699 | A1 | 7/2008 | Horng et al. |
| 2008/0208886 | A1 | 8/2008 | Zhang |
| 2009/0034833 | A1 | 2/2009 | Ozaki et al. |
| 2010/0219491 | A1 | 9/2010 | Lee et al. |
| 2010/0315863 | A1* | 12/2010 | Zhu et al. ...................... 365/158 |

FOREIGN PATENT DOCUMENTS
EP        1885006 A1    2/2008

OTHER PUBLICATIONS

Diao, Zhitao et al., "Spin Transfer Switching in Dual MgO Magnetic Tunnel Junctions", Applied Physics Letters, vol. 90, Issue 13, id. 132508, Mar. 28, 2007, 3 pages, American Institute of Physics.

Huai, Yiming et al., "Spin Transfer Switching Current Reduction in Magnetic Tunnel Junction Based Spin Filter Structures", Applied Physics Letters, vol. 87, Issue 22, id. 222510, Nov. 23, 2005, 3 pages, American Institute of Physics.

Shen, Chih-Ta et al., "Improvement of Transport Properties in Magnetic Tunneling Junctions by Capping Materials", Jun. 2007, pp. 2785-2787, vol. 43, Issue 6, IEEE Transactions on Magnetics.

(Continued)

*Primary Examiner* — Thong Q Le
(74) *Attorney, Agent, or Firm* — Sam Talpalatsky; Nicholas J. Pauley; Jonathan T. Velasco (57) ABSTRACT

A magnetic tunneling junction (MTJ) device and fabrication method is disclosed. In a particular embodiment, an apparatus is disclosed that includes an MTJ device. The MTJ device includes a barrier layer, a free layer, and a magnesium (Mg) capping layer. The free layer is positioned between the barrier layer and the magnesium (Mg) capping layer.

48 Claims, 6 Drawing Sheets

OTHER PUBLICATIONS

Slonczewski, J.C., "Current-Driven Excitation of Magnetic Multilayers", Jun. 1996, pp. L1-L7, vol. 159, No. 1-2, Journal of Magnetism and Magnetic Materials.

Kawahara, Takayuki, et al., "2 Mb SPRAM (SPin-Transfer Torque RAM) With Bit-by-Bit Bi-Directional Current Write and Parallelizing-Direction Current Read", Jan. 2008, pp. 109-120, vol. 43, No. 1, IEEE Journal of Solid-State Circuits.

Lee, Kangho et al., "Magnetic Tunnel Junction Device and Fabrication", U.S. Appl. No. 12/396,359, filed Mar. 2, 2009, 30 pages.

International Search Report and Written Opinion—PCT/US2010/060590, ISA/EPO—Sep. 13, 2011.

\* cited by examiner

MAGNETIC TUNNEL JUNCTION DEVICE AND FABRICATION

FIELD

The present disclosure is generally related to magnetic tunneling junction (MTJ) devices and fabrication, and particularly to an MTJ structure that incorporates a capping layer.

DESCRIPTION OF RELATED ART

MTJ elements may be used to create a magnetic random access memory (MRAM). An MTJ element typically includes a pinned layer, a magnetic tunnel barrier, and a free layer, where a bit value is represented by a magnetic moment in the free layer. A bit value stored by an MTJ element is determined by a direction of the magnetic moment of the free layer relative to a direction of a fixed magnetic moment carried by the pinned layer. The magnetization of the pinned layer is fixed while the magnetization of the free layer may be switched.

When a current flows through the MTJ element, the magnetization direction of the free layer may be changed when the current density exceeds a threshold value, i.e., a critical switching current density ($J_c$). According to a spin-torque-transfer model of J. Sloneczewski, $J_c$ is proportional to an effective damping constant ($\alpha_{eff}$), a saturation magnetization ($M_S$), and a thickness ($t_{free}$) of the free layer, i.e., $J_c \propto \alpha_{eff}(M_S) t_{free}$. Lowering the critical switching current density enables low power consumption and smaller chip area of STT-MRAM technologies, which may be achieved by reducing one or more of $\alpha_{eff}$, $M_S$ and $t_{free}$.

A composite free layer, which consists of two different ferromagnetic materials (e.g., CoFeB and NiFe), may reduce the critical switching current density $J_c$ by decreasing the effective saturation magnetization $M_S$. In addition, having NiFe as part of a composite free layer may also reduce magnetostriction. To further reduce the critical switching current density $J_c$, it may be desirable to use a low $M_S$ material, such as CoFe-X (e.g., CoFeB) or CoFe-X-Y, along with the NiFe. It may also be desirable to decrease the total free layer thickness $t_{free}$. However, when using a thin free layer with low $M_S$, thermal stability ($E_B$) may be significantly compromised, because $E_B \propto M_S t_{free}$. In addition, NiFe typically crystallizes to a face-centered cubic fcc-(111) direction, which may affect the crystallization of the low $M_S$ material below the NiFe. However, with MTJs having an MgO-based tunnel barrier, having a body-centered cubic bcc-(100) crystallization of the free layer may be beneficial to achieving a high tunneling magnetoresistance (TMR). This "template effect" of the NiFe on the crystallization of underlying layers may be exacerbated particularly when decreasing the thickness of the free layer.

SUMMARY

A capping layer adjacent to a free layer of an MTJ device may be formed of metallic magnesium (Mg). The magnesium (Mg) capping layer may increase a tunneling magnetoresistance (TMR) of the MTJ device because of an enhanced crystallization of the free layer. The magnesium (Mg) capping layer may also increase a thermal stability ($E_B$) of the free layer because the magnesium (Mg) capping layer may result in an increased critical magnetic field ($H_c$) and $$E_B = \frac{1}{2} M_S H_c V_{free} \propto M_S H_c t_{free},$$

where $V_{free}$ is the volume of the free layer.

In a particular embodiment, an apparatus is disclosed that includes an MTJ device. The MTJ device includes a barrier layer, a free layer, and a magnesium (Mg) capping layer. The free layer is positioned between the barrier layer and the magnesium (Mg) capping layer.

In another particular embodiment, an apparatus is disclosed that includes an MTJ device. The MTJ device includes a composite free layer, a barrier layer adjacent to the composite free layer, and a magnesium (Mg) capping layer adjacent to the composite free layer. The composite free layer includes a first layer of a first ferromagnetic material and a second layer of a second ferromagnetic material.

In another particular embodiment, an apparatus is disclosed that includes means for storing a data value as an orientation of a magnetic moment that is programmable by a spin polarized current exceeding a critical switching current density. The apparatus also includes tunneling barrier means for providing conduction electrons to the means for storing by quantum mechanical tunneling of conduction electrons through a barrier. The apparatus further includes capping means for increasing a tunneling magnetoresistance (TMR) of the means for storing. The capping means includes metallic magnesium (Mg). The means for storing is positioned between the tunneling barrier means and the capping means.

In another particular embodiment, a method is disclosed that includes forming a free layer above a barrier layer of a magnetic tunneling junction (MTJ) structure. The method also includes forming a magnesium (Mg) capping layer above the free layer.

In another embodiment, the method includes forming a barrier layer, forming a composite free layer, and forming a magnesium (Mg) capping layer. The barrier layer is adjacent to the composite free layer and the magnesium (Mg) capping layer is adjacent to the composite free layer. The composite free layer includes a first layer of a first ferromagnetic material and a second layer of a second ferromagnetic material.

One particular advantage provided by at least one of the disclosed embodiments is to reduce a critical switching current density $J_c \propto \alpha_{eff}(M_S)^2 t_{free}$ by reducing a saturation magnetization $M_S$ and a thickness $t_{free}$ of a composite free layer as compared to MTJ devices that do not include a thin composite free layer. Another particular advantage provided by at least one of the disclosed embodiments is to increase a tunneling magnetoresistance (TMR) of the MTJ device while simultaneously increasing a thermal stability of the free layer as compared to MTJ devices that do not use a magnesium (Mg) capping layer. Other aspects, advantages, and features of the present disclosure will become apparent after review of the entire application, including the following sections: Brief Description of the Drawings, Detailed Description, and the Claims.

DETAILED DESCRIPTION

Figure 1:
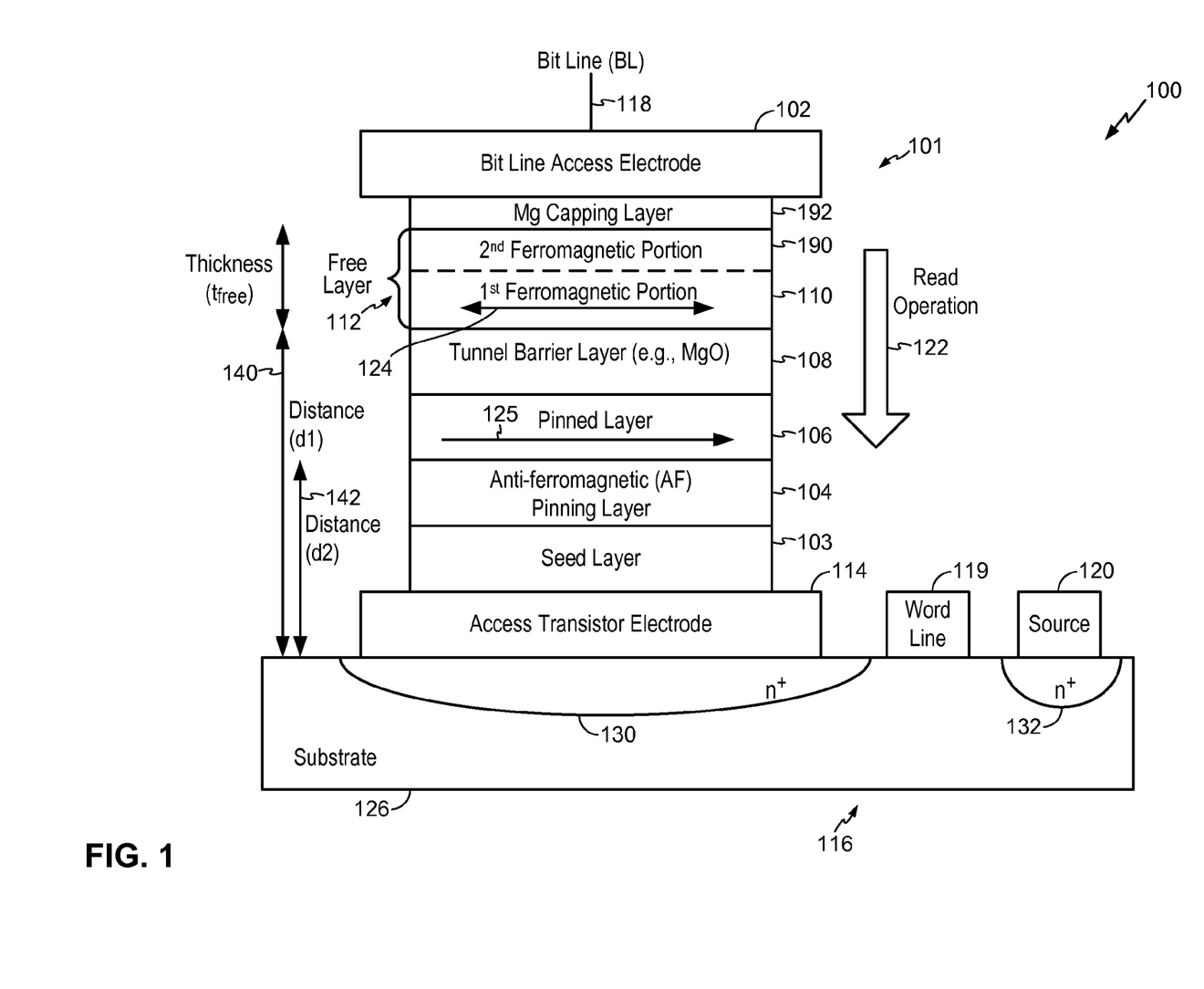
FIG. 1 is an illustrative embodiment of an element of a spin-torque-transfer magnetic random access memory (STT-MRAM) including a magnetic tunneling junction (MTJ) device with a magnesium (Mg) capping layer.

Referring to FIG. 1, a first illustrative embodiment of an element of a spin-torque-transfer magnetic random access memory (STT-MRAM) is depicted and generally designated 100. The element of the STT-MRAM 100 includes a memory cell having a magnetic tunneling junction (MTJ) device 101 and an access transistor 116 on a substrate 126. The MTJ device 101 includes an access transistor electrode 114, a seed layer 103, an anti-ferromagnetic (AF) pinning layer 104, a pinned layer 106, a tunnel barrier layer 108, a free layer 112, a magnesium (Mg) capping layer 192, and a bit line access electrode 102 coupled to a bit line 118. In a particular embodiment, the free layer 112 is a composite layer that includes a first ferromagnetic portion 110 and a second ferromagnetic portion 190. The free layer 112 may have a thickness $t_{free}$. The access transistor electrode 114 is coupled to a drain region 130 of the access transistor 116. The access transistor 116 is gated by a word line 119 and has a source region 132 coupled to a source contact 120.

The seed layer 103 is in contact with the access transistor electrode 114. The seed layer 103 provides a surface for MTJ film deposition and can be composed of several different layers. The AF pinning layer 104 is in contact with the seed layer 103. The AF pinning layer 104 causes an orientation of a magnetic moment 125 of the pinned layer 106 to be pinned in a particular direction. The pinned layer 106 is in contact with the AF pinning layer 104 and may be composed of a ferromagnetic material.

The tunnel barrier layer 108 is in contact with the pinned layer 106 and physically isolates the pinned layer 106 from the free layer 112 while enabling current flow via electron tunneling across the tunnel barrier layer 108. The tunnel barrier layer 108 may be composed of a non-magnetic material. In an illustrative embodiment, the tunnel barrier layer 108 includes magnesium oxide (MgO).

The free layer 112 is in contact with the tunnel barrier layer 108 and is located at a distance d1 140 from the substrate 126. The free layer 112 has a magnetic moment 124 that may be in a parallel or antiparallel alignment with the magnetic moment 125 of the pinned layer 106. The pinned layer 106 may be at a distance d2 142 from the substrate 126 where the distance d2 142 is less than the distance d1 140. Relative to the substrate 126, the free layer 112 is above the pinned layer 106. The magnetic moment 124 of the free layer 112 may be written by a current exceeding a critical switching current and may be read using a current that is less than the critical switching current. For example, the read current may be much less than the critical switching current to prevent read disturbances. In an illustrative embodiment, the free layer 112 is a single ferromagnetic layer. In another illustrative embodiment, the free layer 112 is a composite ferromagnetic layer.

In a particular embodiment, the free layer 112 is a composite layer that includes the first ferromagnetic portion 110 and the second ferromagnetic portion 190. In a particular embodiment, the first ferromagnetic portion 110 includes cobalt and iron. For example, the first ferromagnetic portion 110 may include CoFe, CoFe-X (such as CoFeB), CoFe-X-Y, or any combination thereof. In a particular embodiment, the second ferromagnetic portion 190 includes nickel and iron. For example, the second ferromagnetic portion 190 may include NiFe.

The magnesium (Mg) capping layer 192 is in contact with the free layer 112. The tunnel barrier layer 108 may also include magnesium (Mg) and magnesium oxide (MgO), enabling the use of the same material for multiple layers and reducing the number of materials used during fabrication of the element of the STT-MRAM 100. In a particular embodiment, the magnesium (Mg) capping layer 192 is a metallic layer and consists essentially of magnesium (Mg), such as metallic magnesium (Mg) plus impurities, intentional or otherwise. The magnesium (Mg) capping layer 192 may be configured to increase a tunneling magnetoresistance (TMR) of the MTJ device 101 because of an enhanced crystallization of the free layer 112. The magnesium (Mg) capping layer 192 may getter oxygens from the free layer 112 during an annealing step and reduce the template effect of the second ferromagnetic portion 190 on the first ferromagnetic portion 110, enhancing the crystallization of the first ferromagnetic portion 110. In a particular embodiment, the tunneling magnetoresistance (TMR) is a ratio of a difference between a first resistance in a first state of the MTJ device 101 and a second resistance in a second state of the MTJ device 101 to the second resistance in the second state of the MTJ device 101. For example, the TMR may be proportional to the ratio of the difference between the resistance when the magnetic moment 125 and the magnetic moment 124 are anti-parallel and the resistance when the magnetic moment 125 and the magnetic moment 124 are parallel to the resistance when the magnetic moment 125 and the magnetic moment 124 are parallel, such as $$TMR = \frac{R_{anti-parallel} - R_{parallel}}{R_{parallel}}.$$

The magnesium (Mg) capping layer 192 may also increase a thermal stability ($E_B$) of the free layer 112 because the magnesium (Mg) capping layer 192 may result in an increased critical magnetic field ($H_c$) and $$E_B = \frac{1}{2} M_S H_c V_{free} \propto M_S H_c t_{free},$$

where $V_{free}$ is the volume of the free layer 112 and $t_{free}$ is the thickness of the free layer 112. In a particular embodiment, an increase in the critical magnetic field $H_c$ is greater than a reduction of thermal stability $E_B$ due to the low saturation magnetization $M_S$ of the free layer 112 and due to the decreased thickness $t_{free}$ of the free layer 112 that lead to the reduction in the critical switching current density $J_c \propto \alpha_{eff}(M_S)^2 t_{free}$, so that $J_c$ may be reduced while $E_B$ is increased. Smaller critical switching current density $J_c$ can enable smaller devices, higher density memory arrays, lower power operation, higher clocking frequency, or any combination thereof.

During operation, the direction in which a write current is passed through the MTJ device 101 determines whether the magnetic moment 124 of the free layer 112 is aligned to be parallel or anti-parallel to the magnetic moment 125 of the pinned layer 106. In an illustrative embodiment, a data "1" value may be stored by passing a first write current from the bit line access electrode 102 to the access transistor electrode 114 to align the magnetic moment 124 anti-parallel to the magnetic moment 125. A data "0" value may be stored by passing a second write current from the access transistor electrode 114 to the bit line access electrode 102 to align the magnetic moment 124 parallel to the magnetic moment 125.

When a read operation 122 is performed at the STT-MRAM 100, a read current may flow from the bit line access electrode 102 to the source 120 or the read current may flow from the source 120 to the bit line access electrode 102. In a particular embodiment, a direction of the read current may be determined based on which direction provides the largest read signal. In a particular embodiment, when the read operation 122 is performed on the element of the STT-MRAM 100, a read current flows through the bit line (BL) 118, in a direction from the bitline access electrode 102 to the access transistor electrode 114. The read current through the MTJ device 101 encounters a resistance corresponding to a relative orientation of the magnetic moment 125 and the magnetic moment 124. When the magnetic moment 125 of the pinned layer 106 has a parallel orientation to the magnetic moment 124 of the free layer 112, the read current encounters a resistance different than when the magnetic moment 125 of the pinned layer 106 has an anti-parallel orientation to the magnetic moment 124 of the free layer 112. Generally, when the magnetic moment 125 of the pinned layer 106 has a parallel orientation to the magnetic moment 124 of the free layer 112, the read current encounters a lower resistance than when the magnetic moment 125 of the pinned layer 106 has an anti-parallel orientation to the magnetic moment 124 of the free layer 112.

The bitcell may therefore be used as an element of a memory device, such as an STT-MRAM 100. By employing an appropriate thin composite free layer 112, the saturation magnetization $M_S$ and the thickness $t_{free}$ of the free layer 112 may be substantially reduced, decreasing a critical switching current density $J_c \propto \alpha_{eff}(M_S)^2 t_{free}$. Employing the magnesium (Mg) capping layer 192 may increase a tunneling magnetoresistance (TMR) of the MTJ device 101 because of an enhanced crystallization of the free layer 112. The magnesium (Mg) capping layer 192 may also increase a thermal stability ($E_B$) of the free layer 112 because the magnesium (Mg) capping layer 192 may result in an increased critical magnetic field $$(H_c) \text{ and } E_B = \frac{1}{2} M_S H_c V_{free} \propto M_S H_c t_{free},$$

where $V_{free}$ is the volume of the free layer 112 and $t_{free}$ is the thickness of the free layer 112. In some embodiments, the increase in the critical magnetic field $H_c$ more than compensates for the low saturation magnetization $M_S$ of the free layer 112 and for the decreased thickness $t_{free}$ of the free layer 112 that lead to the reduction in the critical switching current density $J_c \propto \alpha_{eff}(M_S)^2 t_{free}$. Lower power operation and less heat generation may result from decreasing the critical switching current density $J_c$ while increasing the tunneling magnetoresistance (TMR), and operation using shorter write pulse lengths and higher clock frequency may also be enabled.

Figure 2:
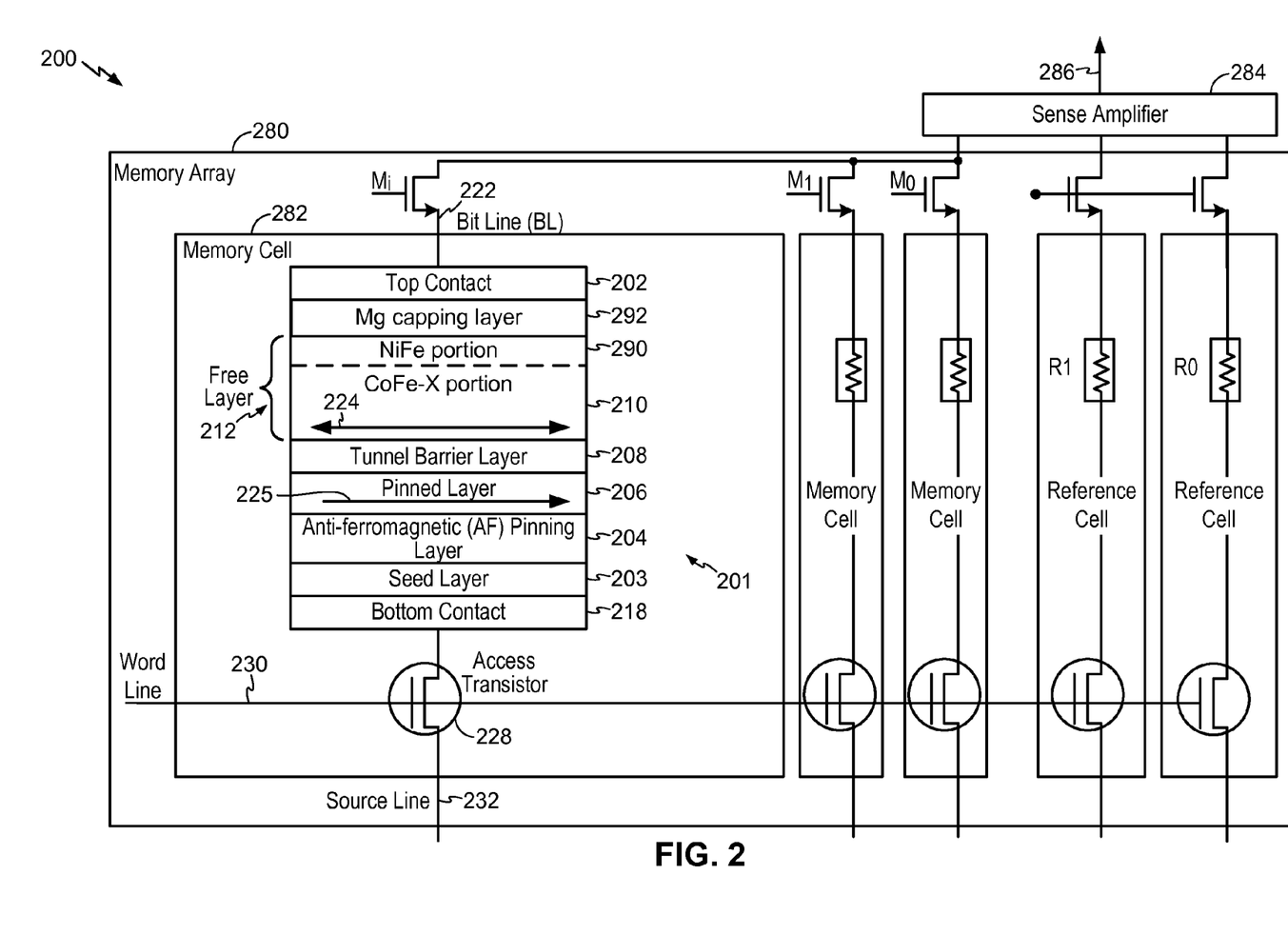
FIG. 2 is an illustrative embodiment of a memory array including a magnetic tunneling junction (MTJ) structure with a magnesium (Mg) capping layer.

Referring to FIG. 2, another illustrative embodiment of a memory system is depicted and generally designated 200. The memory system 200 includes a memory array 280, such as an STT-MRAM memory array, that includes multiple memory cells, including a representative memory cell 282, and a representative pair of reference cells that store a logical high value and a logical low value. A sense amplifier 284 is coupled to receive an output from a selected memory cell in addition to receiving outputs from the reference cells. The sense amplifier 284 is configured to produce an amplifier output 286 that indicates a value stored at the selected memory cell.

The memory cell 282 includes a MTJ structure 201 coupled to an access transistor 228. The MTJ structure 201 includes a top contact 202, a magnesium (Mg) capping layer 292, a free layer 212 having a magnetic moment 224, a tunnel barrier layer 208, a pinned layer 206 having a pinned magnetic moment 225, an anti-ferromagnetic (AF) pinning layer 204, a seed layer 203, and a bottom contact 218. The access transistor 228 is coupled to the bottom contact 218 and coupled to a word line 230 and a source line 232.

The top contact 202 provides a first electrical contact to a bit line 222. The AF pinning layer 204 fixes an orientation of the magnetic moment 225 of the pinned layer 206. The pinned layer 206 may be a synthetic pinned layer including multiple layers (not shown). The tunnel barrier layer 208 may restrict free electron access but enables a tunneling current to the free layer 212. The free layer 212 may store a data value as an orientation of the magnetic moment 224 that is programmable by application of a spin polarized current that exceeds a critical switching current. The free layer 212 is positioned between the tunnel barrier layer 208 and the magnesium (Mg) capping layer 292.

In a particular embodiment, the free layer 212 is a composite layer that includes a first ferromagnetic portion 210 and a second ferromagnetic portion 290. In a particular embodiment, the first ferromagnetic portion 210 includes cobalt and iron. For example, the first ferromagnetic portion 210 may include CoFe, CoFe-X (such as CoFeB), CoFe-X-Y, or any combination thereof. In a particular embodiment, the second ferromagnetic portion 290 includes nickel and iron. For example, the second ferromagnetic portion 290 may include NiFe.

The magnesium (Mg) capping layer 292 may increase the tunneling magnetoresistance (TMR) of the MTJ structure 201 and increase the thermal stability of the free layer 212 in a manner substantially similar to the operation of the magnesium (Mg) capping layer 192 of FIG. 1. The free layer 212 may have low $M_S$ to decrease the critical switching current density $J_c \propto \alpha_{eff}(M_S)^2 t_{free}$. The Mg capping layer 292 may help maintain the TMR and the thermal stability in a manner substantially similar to the operation of the free layer 112 of FIG. 1.

The memory array 280 depicted in FIG. 2 may include multiple cells substantially similar to the representative memory cell 282. The memory array 280, or any other array of cells using the MTJ device 101 of FIG. 1 or the MTJ structure 201 of FIG. 2, may be implemented in an embedded memory, such as a level two (L2) cache or another type of embedded memory, as an illustrative example. Such an array of MTJ cells may be implemented as a STT-MRAM memory to replace memory arrays that use static random access memory (SRAM), dynamic random access memory (DRAM) or flash memory technologies, for example.

Figure 3:
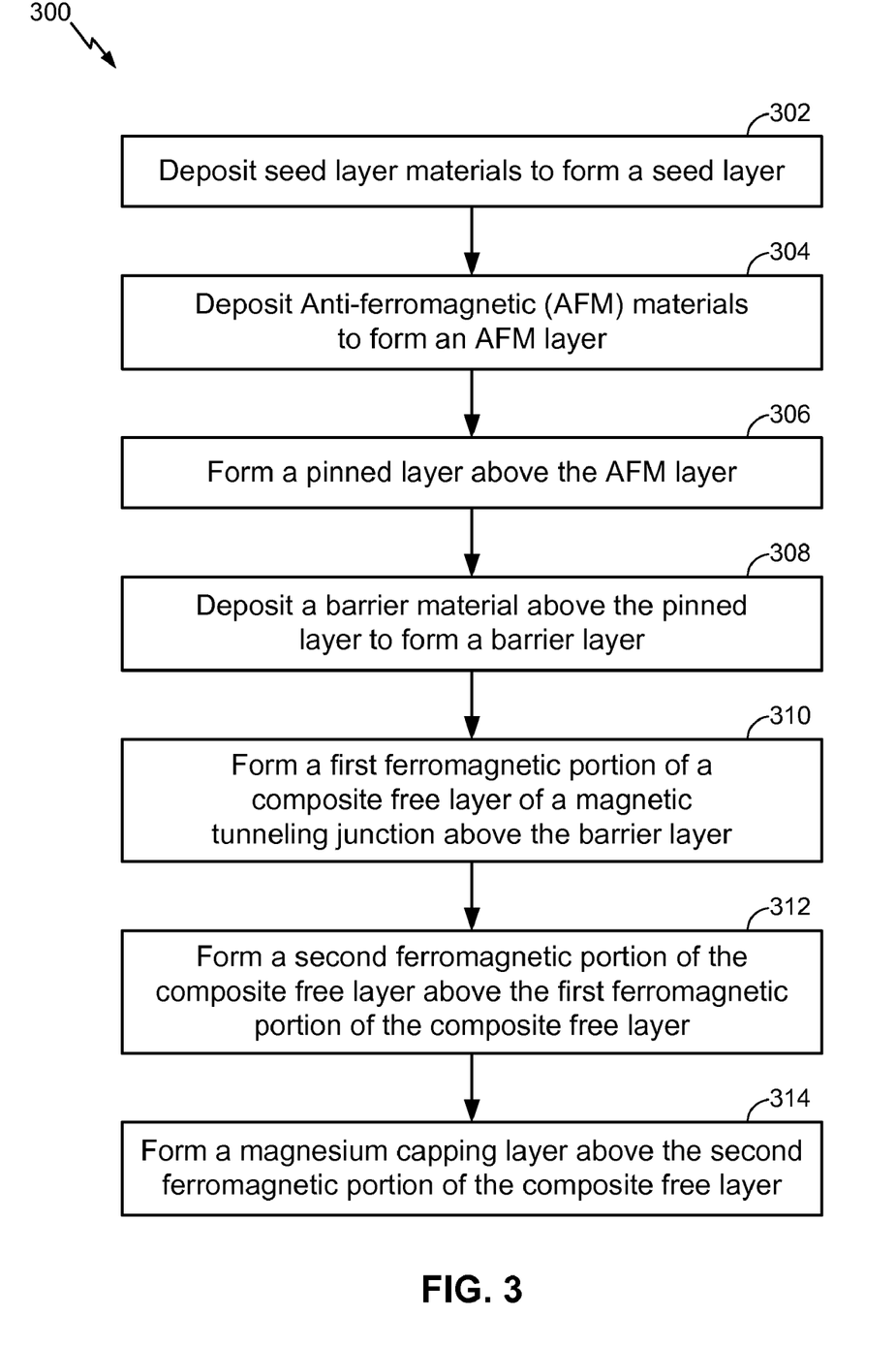
FIG. 3 is a flow diagram of a first illustrative embodiment of a method of forming a magnetic tunneling junction (MTJ) device.

FIG. 3 is a flow diagram of a first illustrative embodiment of a method of forming a magnetic tunneling junction (MTJ) device. In an illustrative embodiment, the MTJ device may be the MTJ device 101 of FIG. 1 or the MTJ structure 201 of FIG. 2. In a particular embodiment, the method includes forming a magnetic tunneling junction by depositing seed layer materials to form a seed layer, at 302, depositing anti-ferromagnetic (AF) materials on the seed layer to form an AF layer, at 304, forming a pinned layer on the AF layer, at 306, and depositing a barrier material on the pinned layer to form a barrier layer, at 308.

Moving to 310, a first ferromagnetic portion of a composite free layer of a magnetic tunneling junction is formed above the barrier layer. In a particular embodiment, the first ferromagnetic portion includes cobalt and iron. For example, the first ferromagnetic portion may include CoFe, CoFe-X (such as CoFeB), CoFe-X-Y, or any combination thereof.

Continuing to 312, a second ferromagnetic portion of the composite free layer is formed above the first portion of the composite free layer. In a particular embodiment, the second ferromagnetic portion includes nickel and iron. For example, the second ferromagnetic portion may include NiFe.

Advancing to 314, a magnesium (Mg) capping layer is formed above the second ferromagnetic portion of the composite free layer. In a particular embodiment, the magnesium (Mg) capping layer increases the tunneling magnetoresistance (TMR) of the magnetic tunnel junction. In a particular embodiment, the magnesium (Mg) capping layer increases the thermal stability ($E_B$) of the composite free layer.

The depositing and the forming of the various materials and layers may be controlled by a processor integrated into an electronic device. For example, the electronic device may be a computer configured to control fabrication machinery.

Figure 4:
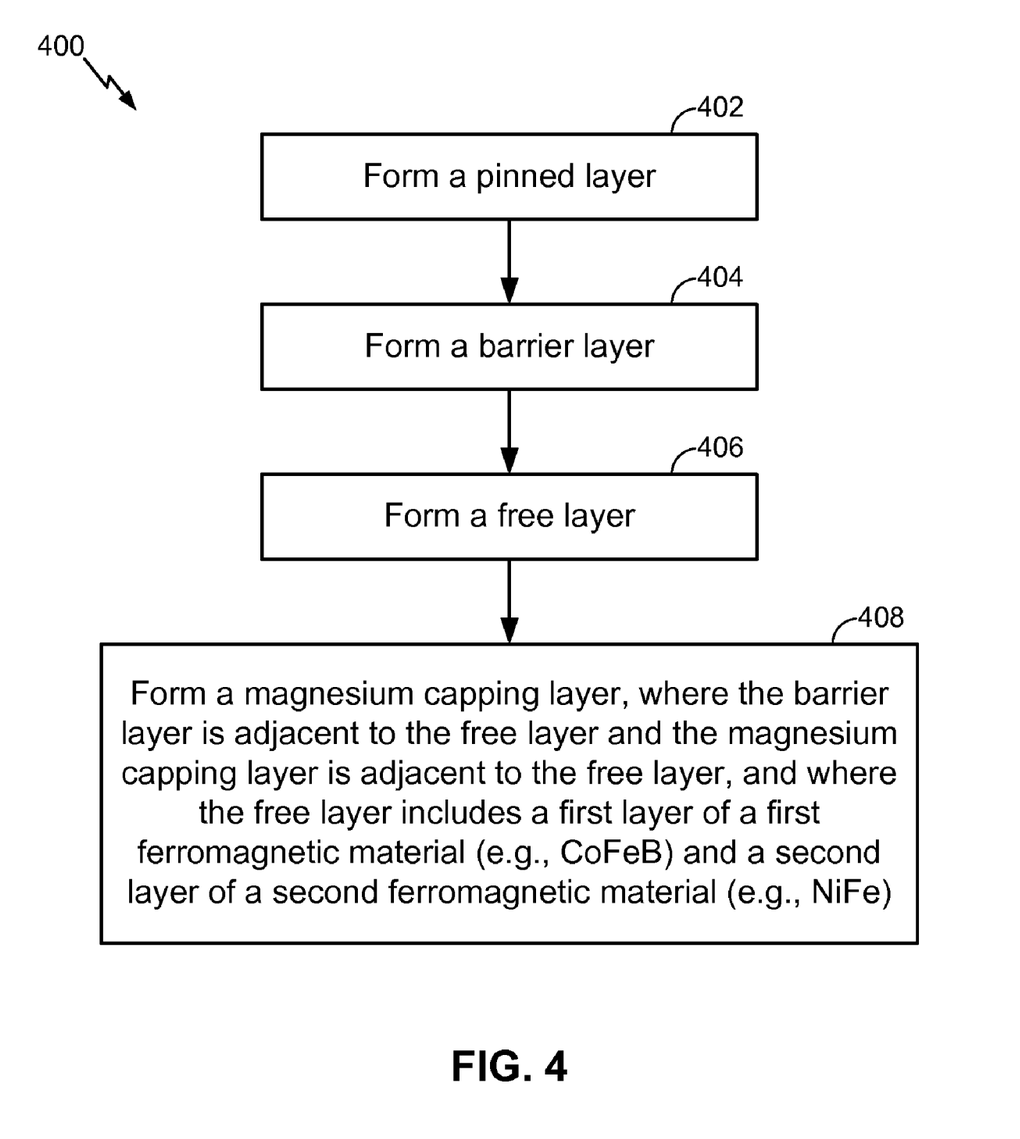
FIG. 4 is a flow diagram of a second illustrative embodiment of a method of forming a magnetic tunneling junction (MTJ) device.

FIG. 4 is a flow diagram of a second illustrative embodiment of a method of forming a magnetic tunneling junction (MTJ) device. In an illustrative embodiment, the MTJ device may be the MTJ device 101 of FIG. 1 or the MTJ structure 201 of FIG. 2. At 402, a pinned layer may be formed. Moving to 404, a barrier layer is formed, and at 406, a free layer is formed.

Continuing to 408, a magnesium (Mg) capping layer is formed, where the barrier layer is adjacent to the free layer and the magnesium (Mg) capping layer is adjacent to the free layer. The free layer includes a first layer of a first ferromagnetic material and a second layer of a second ferromagnetic material. In a particular embodiment, the first ferromagnetic material includes cobalt and iron. For example, the first ferromagnetic material may include CoFe, CoFe-X (such as CoFeB), CoFe-X-Y, or any combination thereof. In a particular embodiment, the second ferromagnetic material includes nickel and iron. For example, the second ferromagnetic material may include NiFe.

In other embodiments, the method of FIG. 4 may be performed in an order that is different than depicted. For example, the magnesium (Mg) capping layer may be formed prior to formation of the free layer. In an alternative embodiment, the MTJ device that is formed may have a reversed structure than depicted in FIG. 1, with the capping layer closer to the substrate than the free layer, and with the free layer closer to the bit line than the capping layer.

Figure 5:
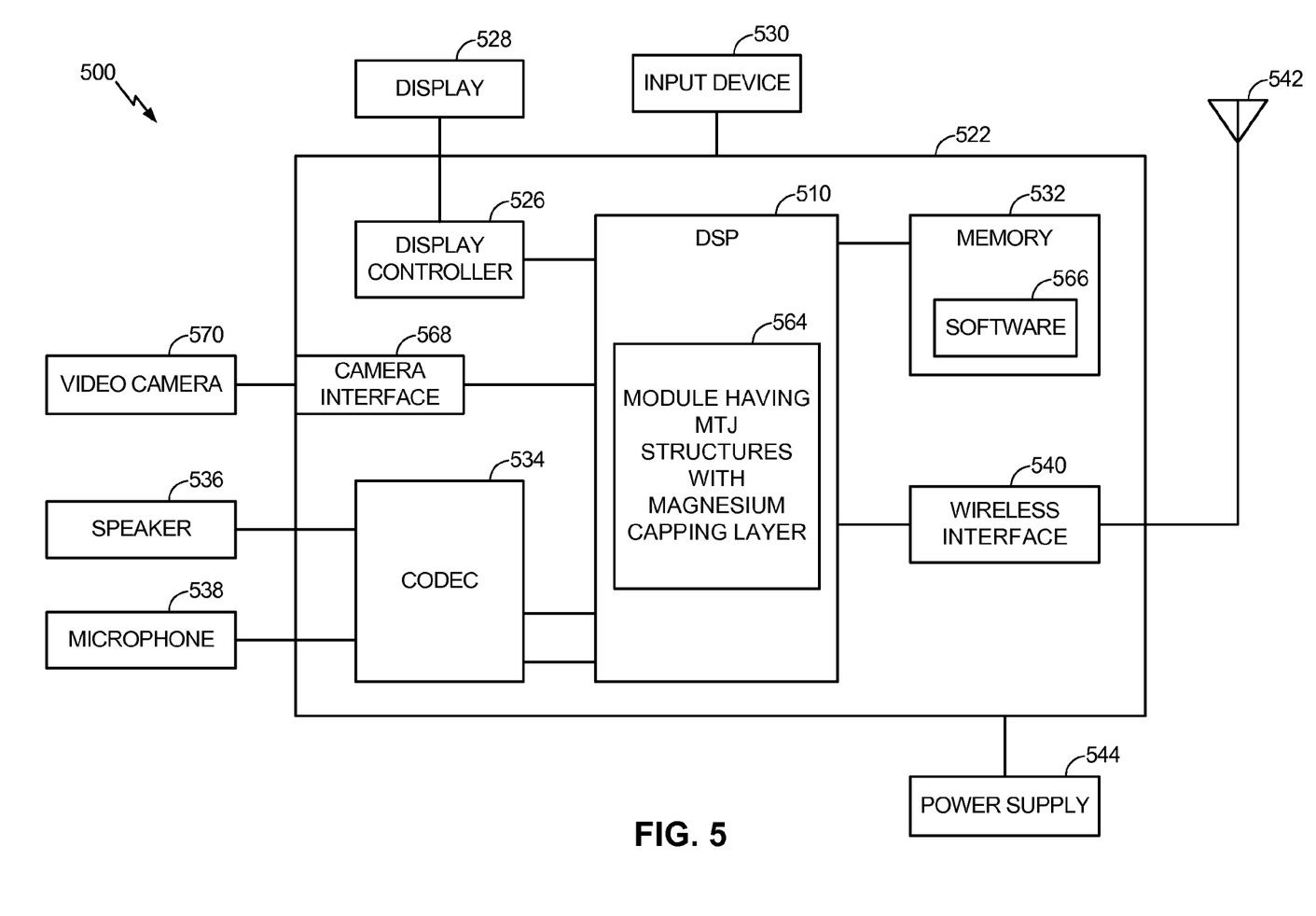
FIG. 5 is a block diagram of a particular embodiment of a portable communication device including a module having MTJ structures with a magnesium (Mg) capping layer.

FIG. 5 is a block diagram of particular embodiment of a system 500 including a module having MTJ structures with a magnesium (Mg) capping layer 564. The system 500 may be implemented in a portable electronic device and includes a processor 510, such as a digital signal processor (DSP), coupled to computer readable medium, such as a memory 532, storing computer readable instructions, such as software 566. The system 500 includes the module having MTJ structures with a magnesium (Mg) capping layer 564. In an illustrative example, the module having MTJ structures with a magnesium (Mg) capping layer 564 includes any of the MTJ structures of FIGS. 1-2, produced in accordance with any of the embodiments of FIGS. 3-4, or any combination thereof. The module having MTJ structures with a magnesium (Mg) capping layer 564 may be in the processor 510 or may be a separate device or circuitry (not shown). In a particular embodiment, as shown in FIG. 5, the module having MTJ structures with a magnesium (Mg) capping layer 564 is accessible to the digital signal processor (DSP) 510. In another particular embodiment, the memory 532 may include an STT-MRAM memory array that includes the module having MTJ structures with a magnesium (Mg) capping layer 564.

A camera interface 568 is coupled to the processor 510 and also coupled to a camera, such as a video camera 570. A display controller 526 is coupled to the processor 510 and to a display device 528. A coder/decoder (CODEC) 534 can also be coupled to the processor 510. A speaker 536 and a microphone 538 can be coupled to the CODEC 534. A wireless interface 540 can be coupled to the processor 510 and to a wireless antenna 542.

In a particular embodiment, the processor 510, the display controller 526, the memory 532, the CODEC 534, the wireless interface 540, and the camera interface 568 are included in a system-in-package or system-on-chip device 522. In a particular embodiment, an input device 530 and a power supply 544 are coupled to the system-on-chip device 522. Moreover, in a particular embodiment, as illustrated in FIG. 5, the display device 528, the input device 530, the speaker 536, the microphone 538, the wireless antenna 542, the video camera 570, and the power supply 544 are external to the system-on-chip device 522. However, each of the display device 528, the input device 530, the speaker 536, the microphone 538, the wireless antenna 542, the video camera 570, and the power supply 544 can be coupled to a component of the system-on-chip device 522, such as an interface or a controller.

Figure 6:
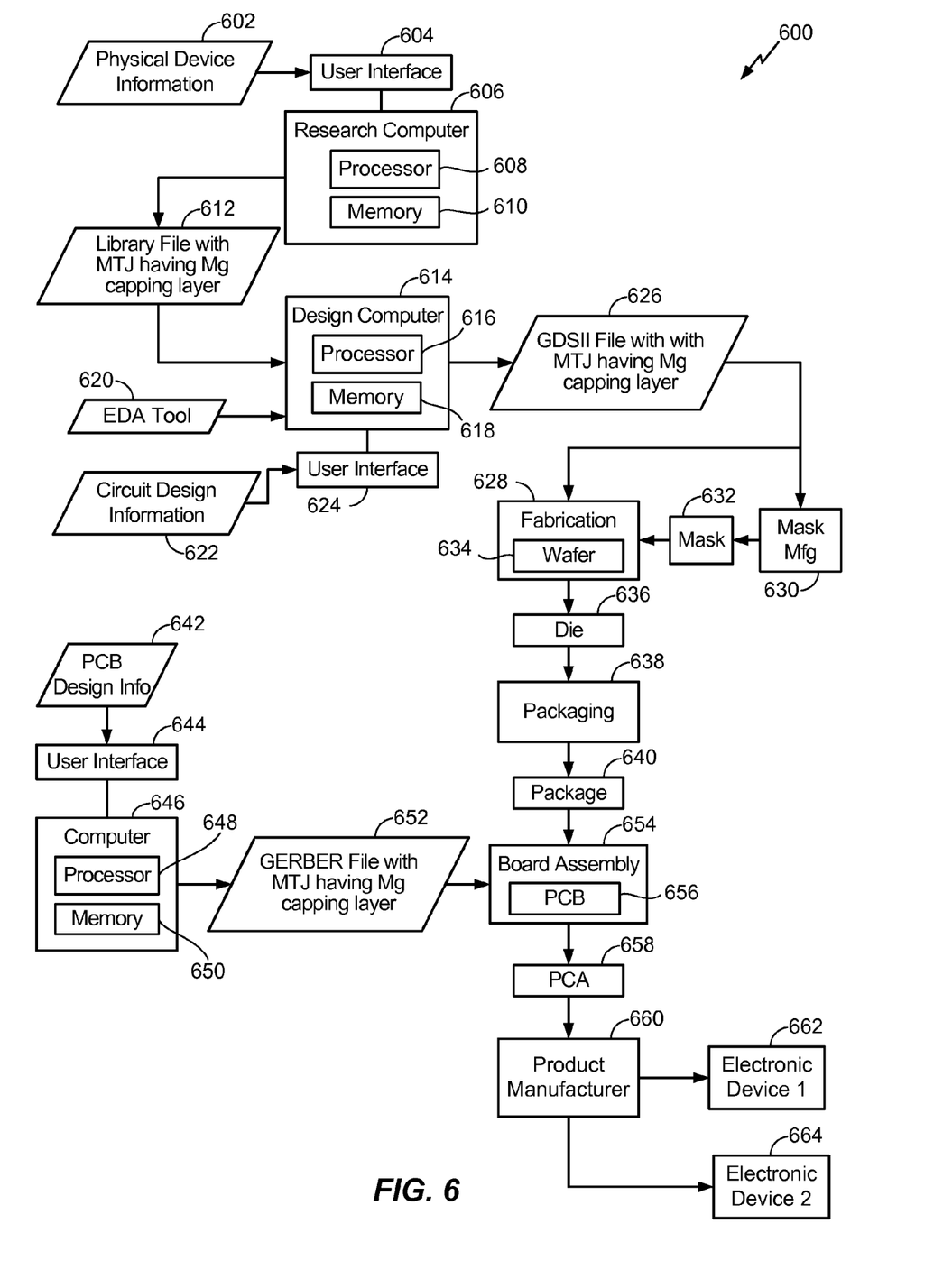
FIG. 6 is a data flow diagram illustrating a manufacturing process for use with magnetic tunneling junction (MTJ) devices.

The foregoing disclosed devices and functionalities (such as the devices of FIG. 1 or FIG. 2, the methods of FIG. 3 or FIG. 4, or any combination thereof) may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in electronic devices. FIG. 6 depicts a particular illustrative embodiment of an electronic device manufacturing process 600.

Physical device information 602 is received in the manufacturing process 600, such as at a research computer 606. The physical device information 602 may include design information representing at least one physical property of a semiconductor device, such as the MTJ device 101 of FIG. 1, the memory array 280 of FIG. 2, the memory cell 282 of FIG. 2, the MTJ structure 201 of FIG. 2, or any combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including the MTJ device 101 of FIG. 1, the memory array 280 of FIG. 2, the memory cell 282 of FIG. 2, the MTJ structure 201 of FIG. 2, or any combination thereof, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit using the MTJ device 101 of FIG. 1, the memory array 280 of FIG. 2, the memory cell 282 of FIG. 2, the MTJ structure 201 of FIG. 2, or any combination thereof, of the library file 612. For example, a user of the design computer 614 may enter circuit design information 622 via a user interface 624 coupled to the design computer 614. The circuit design information 622 may include design information representing at least one physical property of a semiconductor device, such as the MTJ device 101 of FIG. 1, the memory array 280 of FIG. 2, the memory cell 282 of FIG. 2, the MTJ structure 201 of FIG. 2, or any combination thereof. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the MTJ device 101 of FIG. 1, the memory array 280 of FIG. 2, the memory cell 282 of FIG. 2, the MTJ structure 201 of FIG. 2, or any combination thereof, in addition to other circuits or information. To illustrate, the data file may include information corresponding to a system-on-chip (SOC) that includes the memory array 280 of FIG. 2 and that also includes additional electronic circuits and components within the SOC.

The GDSII file 626 may be received at a fabrication process 628 to manufacture the MTJ device 101 of FIG. 1, the memory array 280 of FIG. 2, the memory cell 282 of FIG. 2, the MTJ structure 201 of FIG. 2, or any combination thereof, according to transformed information in the GDSII file 626. For example, a device manufacture process may include providing the GDSII file 626 to a mask manufacturer 630 to create one or more masks, such as masks to be used for photolithography processing, illustrated as a representative mask 632. The mask 632 may be used during the fabrication process to generate one or more wafers 634, which may be tested and separated into dies, such as a representative die 636. The die 636 includes a circuit including the MTJ device 101 of FIG. 1, the memory array 280 of FIG. 2, the memory cell 282 of FIG. 2, the MTJ structure 201 of FIG. 2, or any combination thereof.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including the MTJ device 101 of FIG. 1, the memory array 280 of FIG. 2, the memory cell 282 of FIG. 2, the MTJ structure 201 of FIG. 2, or any combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the MTJ device 101 of FIG. 1, the memory array 280 of FIG. 2, the memory cell 282 of FIG. 2, the MTJ structure 201 of FIG. 2, or any combination thereof. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines for performing various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 6 illustrates remote units according to teachings of the disclosure, the disclosure is not limited to these exemplary illustrated units. Embodiments of the disclosure may be suitably employed in any device which includes active integrated circuitry including memory and on-chip circuitry.

Thus, the MTJ device 101 of FIG. 1, the memory array 280 of FIG. 2, the memory cell 282 of FIG. 2, the MTJ structure 201 of FIG. 2, or any combination thereof, may be fabricated, processed, and incorporated into an electronic device, as described in the illustrative process 600. One or more aspects of the embodiments disclosed with respect to FIGS. 1-4 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. For example, the GDSII file 626 or the fabrication process 628 can include a computer readable tangible medium storing instructions executable by a computer, the instructions including instructions that are executable by the computer to initiate formation of a free layer above a barrier layer of a magnetic tunneling junction structure and instructions that are executable by the computer to initiate formation of a magnesium (Mg) capping layer above the free layer. Although various representative stages of production from a physical device design to a final product are depicted, in other embodiments fewer stages may be used or additional stages may be included. Similarly, the process 600 may be performed by a single entity, or by one or more entities performing various stages of the process 600.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   an in-plane magnetic tunneling junction device comprising:
   a barrier layer;
   a free layer; and
   a magnesium. capping layer, wherein the free layer is positioned between the barrier layer and the magnesium capping layer,
   wherein the magnesium capping layer substantially covers a top surface of the free layer,
   wherein the magnesium capping layer increases a tunneling magnetoresistance (TMR) of the in-plane magnetic tunneling junction device, and
   wherein the TMR is proportional to a ratio of a difference between a first resistance in a first state of the in-plane magnetic tunneling junction device and a second resistance in a second state of the in-plane magnetic tunneling junction device to the second resistance in the second state of the in-plane magnetic tunneling junction device.

2. The apparatus of claim 1, wherein the free layer includes a first ferromagnetic portion and a second ferromagnetic portion.

3. The apparatus of claim 2, wherein the first ferromagnetic portion includes cobalt and iron and wherein the second ferromagnetic portion includes nickel and iron.

4. The apparatus of claim 2, wherein the first ferromagnetic portion is adjacent to the second ferromagnetic portion.

5. The apparatus of claim 1, wherein the magnesium capping layer increases a thermal stability of the free layer.

6. The apparatus of claim 1 integrated into at least one semiconductor die.

7. The apparatus of claim 1, further comprising a memory array that includes the in-plane magnetic tunneling junction device.

8. The apparatus of claim 7, further comprising a device, selected from the group consisting of a set top box, a music player, a video player, an entertainment unit, a navigation device, a communications device, a personal digital assistant (PDA), a fixed location data unit, and a computer, into which the memory array is integrated.

9. An apparatus comprising:
   an in-plane magnetic tunneling junction device comprising:
   a composite free layer;
   a barrier layer adjacent to the composite free layer; and
   a magnesium capping layer adjacent to the composite free layer, wherein the composite free layer includes a first layer of a first ferromagnetic material and a second layer of a second ferromagnetic material, wherein the magnesium capping layer substantially covers a top surface of the free layer, and wherein the first layer of the first ferromagnetic material is adjacent to the second layer of the second ferromagnetic material.

10. The apparatus of claim 9, wherein the barrier layer includes magnesium oxide.

11. The apparatus of claim 9, wherein the first ferromagnetic material includes cobalt and iron and wherein the second ferromagnetic material includes nickel and iron.

12. The apparatus of claim 9, further comprising a pinned layer adjacent to the barrier layer.

13. The apparatus of claim 9 integrated into at least one semiconductor die.

14. The apparatus of claim 9, further comprising a memory array that includes the in-plane magnetic tunneling junction device.

15. The apparatus of claim 14, further comprising a device selected from the group consisting of a set top box, a music player, a video player, an entertainment unit, a navigation device, a communications device, a personal digital assistant (PDA), a fixed location data unit, and a computer, into which the memory array is integrated.

16. An apparatus comprising:
means for storing a data value as an orientation of a magnetic moment that is programmable by a spin polarized current exceeding a threshold current density;
tunneling barrier means for providing conduction electrons to the means for storing by quantum mechanical tunneling of the conduction electrons through a barrier; and
capping means for increasing a tunneling magnetoresistance (TMR) of the means for storing,
wherein the TMR is proportional to a ratio of a difference between a first resistance in a first state of the means for storing and a second resistance in a second state of the means for storing to the second resistance in the second state of the means for storing,
wherein the capping means includes metallic magnesium, wherein the means for storing is positioned between the tunneling barrier means and the capping means, and wherein the capping means substantially covers a top surface of the means for storing.

17. The apparatus of claim 16, wherein the capping means increases a thermal stability of the means for storing.

18. The apparatus of claim 16 integrated in at least one semiconductor die.

19. The apparatus of claim 16, further comprising a memory array that includes the means for storing, the tunneling barrier means, and the capping means.

20. The apparatus of claim 19, further comprising a device selected from the group consisting of a set top box, a music player, a video player, an entertainment unit, a navigation device, a communications device, a personal digital assistant (PDA), a fixed location data unit, and a computer, into which the memory array is integrated.

21. A method comprising:
forming a free layer above a barrier layer of a magnetic tunneling junction structure; and
forming a magnesium capping layer above the free layer,
wherein the magnesium capping layer substantially covers a top surface of the free layer,
wherein the magnesium capping layer increases a tunneling magnetoresistance (TMR) of the magnetic tunneling junction structure, and
wherein the TMR is proportional to a ratio of a difference between a first resistance in a first state of the magnetic tunneling junction structure and a second resistance in a second state of the magnetic tunneling junction structure to the second resistance in the second state of the magnetic tunneling junction structure.

22. The method of claim 21, wherein forming the free layer includes:
forming a first ferromagnetic layer above the barrier layer of the magnetic tunneling junction structure to form a first portion of the free layer; and
forming a second ferromagnetic layer above the first portion of the free layer to form a second portion of the free layer.

23. The method of claim 22, wherein the first ferromagnetic layer includes cobalt and iron and wherein the second ferromagnetic layer includes nickel and iron.

24. The method of claim 21, wherein forming the magnesium capping layer increases a thermal stability of the composite free layer.

25. The method of claim 21, wherein forming the free layer and forming the magnesium capping layer are controlled by a processor integrated into an electronic device.

26. A method comprising:
a first step for forming a free layer above a barrier layer of a magnetic tunneling junction structure; and
a second step for forming a magnesium capping layer above the free layer,
wherein the magnesium capping layer substantially covers a top surface of the free layer,
wherein the magnesium capping layer increases a tunneling magnetoresistance (TMR) of the magnetic tunneling junction structure, and
wherein the TMR is proportional to a ratio of a difference between a first resistance in a first state of the magnetic tunneling junction structure and a second resistance in a second state of the magnetic tunneling junction structure to the second resistance in the second state of the magnetic tunneling junction structure.

27. The method of claim 26, wherein the first step includes:
a third step for forming a first ferromagnetic layer above the barrier layer of the magnetic tunneling junction structure to form a first portion of the free layer; and
a fourth step for forming a second ferromagnetic material above the first portion of the free layer to form a second portion of the free layer.

28. The method of claim 26, wherein the first step and the second step are controlled by a processor integrated into an electronic device.

29. A computer readable tangible medium storing instructions executable by a computer, the instructions comprising:
instructions that are executable by the computer to initiate formation of a free layer above a barrier layer of a magnetic tunneling junction structure; and
instructions that are executable by the computer to initiate formation of a magnesium capping layer above the free layer,
wherein the magnesium capping layer substantially covers a top surface of the free layer,
wherein the magnesium capping layer increases a tunneling magnetoresistance (TMR) of the magnetic tunneling junction structure, and
wherein the TMR is proportional to a ratio of a difference between a first resistance in a first state of the magnetic tunneling junction structure and a second resistance in a second state of the magnetic tunneling junction structure to the second resistance in the second state of the magnetic tunneling junction structure.

30. The computer readable tangible medium of claim 29, the instructions further comprising:
instructions that are executable by the computer to initiate formation of a first ferromagnetic layer above the barrier layer of the magnetic tunneling junction structure to form a first portion of the free layer; and
instructions that are executable by the computer to initiate formation of a second ferromagnetic layer above the first portion of the free layer to form a second portion of the free layer.

31. The computer readable tangible medium of claim 30, wherein the first ferromagnetic layer includes cobalt and iron and wherein the second ferromagnetic layer includes nickel and iron.

32. The computer readable tangible medium of claim 29, wherein the formation of the magnesium capping layer increases a thermal stability of the free layer.

33. A method comprising:
forming a barrier layer;
forming a composite free layer; and
forming a magnesium capping layer, wherein the barrier layer is adjacent to the composite free layer and the magnesium capping layer is adjacent to the composite free layer, wherein the composite free layer includes a first layer of a first ferromagnetic material and a second layer of a second ferromagnetic material, wherein the magnesium capping layer substantially covers a top surface of the composite free layer, and wherein the first layer of the first ferromagnetic material is adjacent to the second layer of the second ferromagnetic material.

34. The method of claim 33, wherein the first ferromagnetic material includes cobalt and iron, and wherein the second ferromagnetic material includes nickel and iron.

35. The method of claim 33, further comprising forming a pinned layer to be adjacent to the barrier layer.

36. A method comprising:
receiving design information representing at least one physical property of a semiconductor device, the semiconductor device including:
a barrier layer;
a composite free layer; and
a magnesium capping layer, wherein the composite free layer is positioned between the barrier layer and the magnesium capping layer,
wherein the magnesium capping layer substantially covers a top surface of the composite free layer,
wherein the magnesium capping layer increases a tunneling magnetoresistance (TMR) of the semiconductor device, and
wherein the TMR is proportional to a ratio of a difference between a first resistance in a first state of the semiconductor device and a second resistance in a second state of the semiconductor device to the second resistance in the second state of the semiconductor device;
transforming the design information to comply with a file format; and
generating a data file including the transformed design information.

37. The method of claim 36, wherein the composite free layer includes a cobalt and iron portion and a nickel and iron portion.

38. The method of claim 36, wherein the data file has a GDSII format.

39. A method comprising:
receiving a data file including design information corresponding to a semiconductor device; and
fabricating the semiconductor device according to the design information, wherein the semiconductor device includes:
a barrier layer;
a composite free layer; and
a magnesium capping layer, wherein the composite free layer is positioned between the barrier layer and the magnesium capping layer,
wherein the magnesium capping layer substantially covers a top surface of the composite free layer,
wherein the magnesium capping layer increases a tunneling magnetoresistance (TMR) of the semiconductor device, and
wherein the MIR is proportional to a ratio of a difference between a first resistance in a first state of the semiconductor device and a second resistance in a second state of the semiconductor device to the second resistance in the second state of the semiconductor device.

40. The method of claim 39, wherein the composite free layer includes a cobalt and iron portion and a nickel and iron portion.

41. The method of claim 39, wherein the data file has a GDSII format.

42. A method comprising:
receiving design information including physical positioning information of a packaged semiconductor device on a circuit board, the packaged semiconductor device including a semiconductor structure comprising:
a barrier layer;
a composite free layer; and
a magnesium capping layer, wherein the composite free layer is positioned between the barrier layer and the magnesium capping layer,
wherein the magnesium capping layer substantially covers a top surface of the composite free layer,
wherein the magnesium capping layer increases a tunneling magnetoresistance (TMR) of the semiconductor device, and
wherein the TMR is proportional a ratio of a difference between a first resistance in a first state of the semiconductor device and a second resistance in a second state of the semiconductor device to the second resistance in the second state of the semiconductor device; and transforming the design information to generate a data file.

43. The method of claim 42, wherein the composite free layer includes a cobalt and iron portion and a nickel and iron portion.

44. The method of claim 43, wherein the data file has a GERBER format.

45. A method comprising:
receiving a data file including design information including physical positioning information of a packaged semiconductor device on a circuit board; and
manufacturing, the circuit board configured to receive the packaged semiconductor device according to the design information, wherein the packaged semiconductor device includes a semiconductor memory array comprising at least one memory cell that includes:
a barrier layer;
a composite free layer; and
a magnesium capping layer, wherein the composite free layer is positioned between the barrier layer and the magnesium capping layer,
wherein the magnesium capping layer substantially covers a top surface of the composite free layer,
wherein the magnesium capping layer increases a tunneling magnetoresistance (TMR) of the memory cell, and
wherein the TMR is proportional to a ratio of a difference between a first resistance in a first state of the memory cell and a second resistance in a second state of the memory cell to the second resistance in the second state of the memory cell.

46. The method of claim 45, wherein the composite free layer includes a cobalt and iron portion and a nickel and iron portion.

47. The method of claim 45, wherein the data file has a GERBER format.

48. The method of claim 45, further comprising integrating the circuit board into a device selected from the group consisting of a set top box, a music player, a video player, an entertainment unit, a navigation device, a communications device, a personal digital assistant (PDA), a fixed location data unit, and a computer.

* * * * *